US006362046B1

United States Patent
Arai

(10) Patent No.: US 6,362,046 B1
(45) Date of Patent: Mar. 26, 2002

(54) SEMICONDUCTOR DEVICE ALLOWING ELECTRICAL WRITING AND ERASING OF INFORMATION AND METHOD OF MANUFACTURING THE SAME

(75) Inventor: Hajime Arai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/618,764

(22) Filed: Jul. 18, 2000

Related U.S. Application Data

(62) Division of application No. 08/706,965, filed on Sep. 3, 1996, now Pat. No. 6,111,287, which is a continuation of application No. 08/455,167, filed on May 31, 1995, now abandoned.

(30) Foreign Application Priority Data

Aug. 30, 1994 (JP) .............................. 6-204869

(51) Int. Cl.$^7$ .............................................. H03L 21/336
(52) U.S. Cl. ...................... 438/257; 438/588; 438/593
(58) Field of Search .............................. 438/257–267, 438/588, 593; 257/314–326

(56) References Cited

U.S. PATENT DOCUMENTS

| 4,380,057 A | 4/1983 | Kotecha et al. |
| 4,698,787 A | 10/1987 | Mikherjee et al. |
| 4,868,619 A | 9/1989 | Mukherjee et al. |
| 5,021,999 A | 6/1991 | Kuhda et al. |
| 5,293,328 A | 3/1994 | Amin et al. |
| 5,394,360 A | * 2/1995 | Fukumoto ............... 365/185.15 |
| 5,399,891 A | 3/1995 | Yin et al. |
| 5,440,158 A | 8/1995 | Sung-Mu |
| 5,455,793 A | 10/1995 | Amin et al. |
| 5,517,044 A | * 5/1996 | Koyama ..................... 257/316 |
| 5,674,768 A | * 10/1997 | Chang et al. ................ 438/264 |

FOREIGN PATENT DOCUMENTS

| JP | 61-216482 | | 9/1986 |
| JP | 62-97987 | | 5/1987 |
| JP | 63-29979 | * | 2/1988 |
| JP | 2-78276 | | 3/1990 |
| JP | 4-336469 | | 11/1992 |

* cited by examiner

Primary Examiner—Olik Chaudhuri
Assistant Examiner—Marcos D. Pizarro-Crespo
(74) Attorney, Agent, or Firm—McDermott, Will & Emery

(57) ABSTRACT

In a semiconductor device and a method of manufacturing the same, two floating gate electrodes are independently controlled with one control gate electrode. In the semiconductor device, the first floating gate electrode is formed on a channel region with a first gate insulating film therebetween, and the control gate electrode is formed on the first floating gate electrode with a first interlayer insulating film therebetween. The second floating gate electrode exists on the control gate electrode and has a portion extended above a semiconductor substrate and overlapping with a second impurity diffusion layer. A first impurity diffusion layer overlaps with an end of the first floating gate electrode. Thereby, writing, erasing and reading are effected on the two, i.e., first and second floating gate electrodes with one control gate electrode while maintaining the substantially same memory cell area as the prior art.

3 Claims, 19 Drawing Sheets

ERASE

WRITE

1ST FLOATING GATE READING [ERASED STATE]

1ST FLOATING GATE READING [WRITTEN STATE]

WRITE

ERASE

US 6,362,046 B1

SEMICONDUCTOR DEVICE ALLOWING ELECTRICAL WRITING AND ERASING OF INFORMATION AND METHOD OF MANUFACTURING THE SAME

This application is a divisional of Ser. No. 08/706,965, filed Sep. 3, 1996, now U.S. Pat. No. 6,111,287, which is a continuation of Ser. No. 08/455,167, filed May 31, 1995, now abandoned.

TITLE OF THE INVENTION

Semiconductor Device Allowing Electrical Writing and Erasing of Information and Method of Manufacturing the Same

BACKGROUND OF THE INVENTION

1. Field of the Invention

The present invention relates to a semiconductor device and a method of manufacturing the same, and in particular, to a semiconductor device allowing electrical writing and erasing of information as well as a method of manufacturing the same.

2. Description of the Background Art

As a kind of semiconductor memory device, there has been known a nonvolatile semiconductor memory device. As a kind of nonvolatile semiconductor memory device, there has been known an EEPROM (Electrically Erasable and Programmable Read Only Memory) in which data can be freely programmed and which allows electrical writing and erasing of information. Although the EEPROM has an advantage that both writing and erasing can be executed electrically, it disadvantageously requires two transistors for each memory cell, and therefore integration to a higher degree is difficult. For this reason, there has been proposed a flash EEPROM including memory cells, each of which is formed of one transistor, and allowing electrical entire chip erasing of written electric information charges. This is disclosed, for example, in U. S. Pat. No. 4,868,619. This flash memory is suitable for high integration because each memory cell is formed of one transistor as described above.

FIG. 25 is an equivalent circuit diagram fragmentarily showing a memory cell array structure of a conventional flash memory. Referring to FIG. 25, M00–M35 indicate memory transistors functioning as memory elements. A drain, a gate and a source in each memory transistor are connected to a corresponding bit line (BL0–BL3), a corresponding word line (WL0–WL5) and a source line (SL0), respectively.

FIG. 26 is a plan showing an actual pattern structure of the memory cell array shown in FIG. 25. Referring to FIG. 26, lines BL0–BL3, WL0–WL5 and SL0 correspond to the bit lines, word lines and source line denoted by the same reference characters in FIG. 25. Element isolating regions 1 are formed at predetermined regions with a predetermined space between each other. Floating gate electrodes 3 are formed at predetermined regions under word lines (WL0–WL5), and control gate electrodes 5 connected to the word lines are formed on floating gate electrodes 3. Metal interconnections 8 made of, e.g., aluminum interconnections and forming bit lines (BL0–BL3) extend perpendicularly to word lines (WL0–WL5).

FIGS. 27 to 32 are cross sections taken along line 100—100 in FIG. 26 and showing the structure during manufacturing in accordance with the order of process steps. FIGS. 33 to 37 are cross sections taken along line 200—200 in FIG. 26 and showing the structure during manufacturing in accordance with the order of process steps. Referring to FIGS. 27 to 37, the manufacturing process of the conventional flash memory will be described below.

First, as shown in FIG. 27, element isolating regions 1 are formed on a surface of a semiconductor substrate 101 by the LOCOS (LOCal Oxidation of Silicon) method of the like. Then, as shown in FIG. 28, first gate oxide films 2a are formed, e.g., by the thermal oxidation method on portions of the surface of semiconductor substrate at which element isolating regions 1 do not exist. A polycrystalline silicon film (not shown) is deposited by the CVD (Chemical Vapor Deposition) method, and subsequently is patterned along an extending direction of the word line by the photolithography and dry etching technique. Thereby, first gate electrodes 3a are formed. Then, as shown in FIG. 33, an interlayer insulating layer 4a is formed on first gate electrodes 3a by the thermal oxidation method or CVD method. A second gate electrode 5a formed of a polycrystalline silicon film or a polycide film (i.e., multilayer film formed of a polycrystalline silicon film and a metal silicide film of a high melting point) is formed on interlayer insulating layer 4a by the CVD method. The photolithography and dry etching technique are executed to pattern second gate electrode 5a, interlayer insulating layer 4a, first gate electrode 3a and first gate oxide film 2a to extend them perpendicularly to the extending direction of the word line. Thereby, first gate oxide films 2, floating gate electrodes 3, interlayer insulating layers 4 and control gate electrodes 5 are formed as shown in FIGS. 29 and 34. Thereafter, impurity is ion-implanted into semiconductor substrate 101 to form drain regions 13 and source regions 14 using the control gate electrodes 5 as a mask.

As shown in FIGS. 30 and 35, an interlayer insulating layer 6 is formed, e.g., by the CVD method, and contact holes 7 are formed by the photolithography and dry etching technique.

As shown in FIGS. 31 and 36, a metal interconnection layer (not shown) made of, e.g., aluminum alloy is formed on the whole surface by the sputtering method or the like, and subsequently is patterned by the photolithography and dry etching technique. Thereby, metal interconnection layers 18 forming the bit lines and source line are formed.

As shown in FIGS. 32 to 37, a surface protective film 9 is formed by the CVD method. Surface protective film 9 covers portions other than bonding pad connections (not shown). In this manner, the conventional flash memory is completed.

Operation of the conventional flash memory will be described below. The flash memories of 1 to 8 megabits which are now available are operated by the CHE injection writing, i.e., writing by injection of channel hot electrons and the tunnel erasing, i.e., tunnel removal thereof from a source. As another method of writing and erasing in the flash memory, the tunnel writing and tunnel erasing may be employed, by which both writing and erasing are carried out with a tunnel current.

FIG. 38 shows a concept of variation of memory transistor characteristics caused by writing and erasing. FIG. 39 shows a concept of writing of a flash memory by the CHE injection. FIG. 40 shows a concept of erasing of the flash memory by the tunnel erasing.

For performing writing by the CHE injection, semiconductor substrate 101 and source region 14 of the memory transistor, on which writing is effected, are grounded as shown in FIGS. 38 and 39. A voltage Vd from 5V to 8V is applied to drain region 13 via the bit line. A voltage Vg from 10V to 13V is applied to control gate electrode 5 via the word line. Thereby, hot electrons generated by high electric charges near the drain are injected into floating gate electrode 3. By maintaining the electrons in floating gate electrode 3, the threshold voltage of memory transistor is shifted, so that the writing is completed.

The writing can be performed in either a timing mode similar to that of the conventional EPROM or a command mode in which a chip internally and automatically performs the writing in accordance with a command and a data applied thereto. In either mode, a write depth at the written position is generally verified, and, if shallow, additional writing is effected. More specifically, as shown in FIG. 41, a write pulse is applied at step S1, and write verification is performed at subsequent step S2. If the result of write verification represents the shallow write, the process returns to step S1 for additional writing. If the result of write verification represents the sufficient writing, the writing is completed as indicated at step S3.

The tunnel erasing will be described below with reference to FIGS. 38 and 40. For the tunnel erasing, drain region 13 is set to a floating state, and control gate electrode 5 and semiconductor substrate 10 are grounded. A high voltage Vs, e.g., from 8V to 12V is applied to source region 14. In this case, the potential of floating gate electrode 3 depends on the potential set by electrons in floating gate electrode 3 as well as capacitance coupling between the floating gate and control gate, between floating gate and source region and between floating gate and substrate.

Since an area of overlapped portions of floating gate electrode 3 and source region 14 is small relatively to a whole area of the channel region, a capacitance between the floating gate electrode and source region is small relatively to a capacitance between the floating gate and control gate and a capacitance between the floating gate and substrate. Therefore, the potential of floating gate electrode 3 is relatively close to the potential (ground potential) of control gate electrode 5 and semiconductor substrate 101. In this case, if electrons are accumulated in the floating gate electrode 3, the potential of floating gate electrode 3 further decreases. Therefore, a strong electric field is produced across floating gate electrode 3 and source region 14, so that the electrons in floating gate electrode 3 are removed into source region 14 by this strong electric field. In this manner, erasing of the memory transistor is performed.

In the flash memory, entire chip erasing is executed or it is erased a block at a time. Therefore, if the bits are maintained at different states, i.e., data written state and data unwritten state before the erasing, the bits having a low threshold voltage will be over-erased to attain the depletion state, resulting in increase of a proportion of defective. Generally, variation of the threshold voltage is suppressed by entire bit writing before the erasing, as shown in FIG. 42. More specifically, after the entire bit writing, an erase pulse is applied at step S5, and it is checked at step S6 whether the erasing is actually executed. If the erasing is insufficient, the process returns to step S5 to apply the erase pulse again. If the erasing is sufficient, the erasing process is completed as indicated at step S7.

The tunnel writing will now be described below. In this case, the writing is executed by the tunnel current from semiconductor substrate 101 through first gate insulating film 2. For example, voltage Vg of about 10V is applied to control gate electrode 5, and voltage Vs of about −10V is applied to semiconductor substrate 101.

As compared with the tunnel erasing from source region 14, the tunnel writing causes a large potential difference between control gate electrode 5 and semiconductor substrate 101. In this tunnel writing, however, a capacitance between the control gate and floating gate is substantially equal to a capacitance between the floating gate and substrate, so that floating gate electrode 3 has a potential nearly intermediate the potentials of semiconductor substrate 101 and control gate electrode 5, and thus an electric field across the floating gate and substrate is nearly equal to that in the source erasing.

Instead of applying the write voltage to semiconductor substrate 101, the voltage applied to control gate electrode 5 may be raised to about 20V, which also enables writing. In a device of a design rule level not exceeding 1 $\mu$m, however, an impurity diffusion layer has a low junction breakdown voltage not exceeding about 10V, so that it is difficult to use the high voltage of about 20V in such a minute device.

Instead of the aforementioned method of removing electrons from source region 14, erasing may be executed by such a method that electrons are removed from floating gate electrode 3 to semiconductor substrate 101 through first gate insulating film 2 in a manner opposite to the tunnel writing. In this case, erasing is executed by applying a negative voltage of about −10V to control gate electrode 5 and applying a positive voltage of about 10V to semiconductor substrate 101.

In the conventional flash memory, since each memory element is formed of one transistor as described above, the cell structure is more suitable for miniaturization than those of other semiconductor memory devices. However, the degree of integration of the flash memory depends on the process limit or work limit of the apparatus manufacturing the semiconductor device. Therefore, it has been very difficult to miniaturize the flash memory to an extent exceeding the process limit of the semiconductor device manufacturing apparatus.

SUMMARY OF THE INVENTION

An object of the invention is to provide a semiconductor device which can be integrated to a higher extent with a miniaturizing technique of the same level as the prior art.

Another object of the invention is to provide a method allowing easy manufacturing of a semiconductor device, of which degree of integration is higher than that in the prior art, with a miniaturizing technique of the same level as the prior art.

A semiconductor device of one aspect of the invention includes a semiconductor substrate, first and second impurity regions, a first floating gate electrode, a control gate electrode and a second floating gate electrode. The semiconductor substrate has a main surface, and is of a first conductivity type. The first and second impurity regions are formed on the main surface of the semiconductor substrate with a predetermined space defining a channel region therebetween, and are of a second conductivity type. The first floating gate electrode is formed on the channel region with a first gate insulating film therebetween and has an end overlapping with the first impurity region. The control gate electrode is formed on an upper surface of the first floating gate electrode with a first interlayer insulating film therebetween. The second floating gate electrode is formed on an upper surface and a side surface of the control gate electrode with a second interlayer insulating film therebetween, and is formed on the channel region with a second gate insulating film therebetween to have an end overlapping with the second impurity region. Preferably, the second floating gate electrode may be extended over the first impurity region with the second gate insulating film therebetween. Preferably, the second floating gate electrode may have the other end located above a region at which the control gate electrode is formed.

According to the semiconductor device of the above aspect, the first floating gate electrode has the end overlapping with the first impurity region, and the second floating gate electrode formed on the upper surface of the control gate electrode on the first floating gate electrode has the end overlapping with the second impurity region. Therefore, the semiconductor device can independently effect writing, erasing and reading of data on the two, i.e., first and second floating gate electrodes with one control gate electrode. Thereby, the memory capacitance can be doubled with the substantially same memory size as that in the prior art.

According to another aspect of the invention, a semiconductor device allowing electrical writing and erasing of information includes a semiconductor substrate, first and second impurity regions, a first floating gate electrode, a second floating gate electrode and a control gate electrode. The second floating gate electrode is formed on an upper surface and a side surface of the first floating gate electrode with a first interlayer insulating film therebetween, and is formed on a channel region with a second gate insulating film therebetween to have an end overlapping with the second impurity region. The control gate electrode is formed on the upper surface of the first floating gate electrode with the first interlayer insulating film therebetween, and is formed on a side surface and an upper surface of the second floating gate electrode with a second interlayer insulating film therebetween.

According to the semiconductor device of the above aspect, the first floating gate electrode has the end overlapping with the first impurity region, the second floating gate electrode formed on the first floating gate electrode has the end overlapping with the second impurity region, and the first and second floating gate electrodes are covered with the control gate electrode. Therefore, semiconductor device can independently effect writing, erasing and reading of data on the two, i.e., first and second floating gate electrodes with one control gate electrode. Thereby, the memory capacitance can be doubled with the substantially same memory size as that in the prior art.

According to still another aspect of the invention, a semiconductor device allowing electrical writing and erasing of information includes a semiconductor substrate, first and second impurity regions, a first floating gate electrode, a second floating gate electrode and a control gate electrode. The second floating gate electrode is formed on a channel region with a first gate insulating film therebetween to form a predetermined space with respect to the first floating gate electrode and has an end overlapping with the second impurity region. The control gate electrode is formed on upper surfaces and side surfaces of the first and second floating gate electrodes with a first interlayer insulating film therebetween, and is formed on the channel region with a first gate insulating film therebetween. Preferably, a third impurity region may be formed at a region of the channel region located between the first floating gate electrode and the second floating gate electrode.

According to the semiconductor device of the above aspect, the first and second floating gate electrodes are formed on the first gate insulating film with a predetermined space between each other and have the ends overlapping with the first and second impurity regions, respectively. The control gate electrode is formed on not only the upper surfaces but also the side surfaces of the first and second floating gate electrodes with the first interlayer insulating film therebetween. Therefore, a capacitance is increased by an amount corresponding to the portion of the control gate electrode formed on the side surface of the second floating gate electrode. Thereby, the capacitance coupling ratio increases, so that the potential of the floating gate increases during writing and erasing. Consequently, writing and easing can be executed easily. Also this semiconductor device independently effects writing, erasing and reading of data on the two, i.e., first and second floating gate electrodes with one control gate electrode. Thereby, the degree of integration can increase to some extent as compared with the prior art. A third impurity region may be formed at a region between the first floating gate electrode and the second floating gate electrode, which prevents formation of a parasitic transistor at the above region.

According to a method of manufacturing a semiconductor device of an aspect of the invention, a first gate insulating film is formed on a main surface of a semiconductor substrate of a first conductivity type. A first floating gate electrode is formed on the first gate insulating film. A control gate electrode is formed on the first floating gate electrode with a first interlayer insulating film therebetween. Impurity is introduced into the semiconductor substrate using the first floating gate electrode as a mask to form a first impurity region of a second conductivity type having a region overlapping with an end of the first floating gate electrode. A second interlayer insulating film is formed on an upper surface and a side surface of the control gate electrode and a side surface of the first floating gate electrode. A second gate insulating film is formed on the main surface of the semiconductor substrate. A second floating gate electrode is formed on the second interlayer insulating film and the second gate insulating film to have a portion located on the control gate electrode and at least an end extended to a position on the semiconductor substrate near the other end of the first floating gate electrode. Impurity is introduced into the semiconductor substrate using the second floating gate electrode as a mask to form a second impurity region of the second conductivity type having a region overlapping with an end of the second floating gate electrode.

Thereby, the method can easily manufacture the semiconductor device which can independently effect writing, erasing and reading on the two, i.e., first and second floating gate electrodes with one control gate electrode.

According to a method of manufacturing a semiconductor device of another aspect of the invention, a first gate insulating film is formed, and a floating gate electrode is formed on the first gate insulating film. A first interlayer insulating film is formed on an upper surface and a side surface of the first floating gate electrode. A second gate insulating film is formed on a main surface of a semiconductor substrate. A second floating gate electrode is formed on the first interlayer insulating film and the second gate insulating film to have a portion located above the first floating gate electrode and at least an end extended to a position on the semiconductor substrate near one end of the first floating gate electrode. A second interlayer insulating film is formed at least on an upper surface of the second floating gate electrode. A control gate electrode is formed on upper surfaces of the first and second floating gate electrodes with the first and second interlayer insulating films therebetween, respectively. Impurity is introduced into the semiconductor substrate using the control gate electrode as a mask to form a first impurity region of a second conductivity type having a region overlapping with the other end of the first floating gate electrode and a second impurity region of the second conductivity type having a region overlapping with an end of the second floating gate electrode.

According to the method of manufacturing the semiconductor device of the above aspect, the first impurity region having the region overlapping with the other end of the first floating gate electrode and the second impurity region having the region overlapping with the one end of the second floating gate electrode are formed at the same step. Therefore, a manufacturing process can be simplified as compared with the case where the first and second impurity regions are formed at different steps.

According to a method of manufacturing a semiconductor device of still another aspect of the invention, a gate insulating film is formed on a main surface of a semiconductor substrate. A floating gate electrode layer is formed on the gate insulating film and is subsequently patterned to form first and second floating gate electrodes on the gate insulating film with a predetermined space between each other. An interlayer insulating film is formed on upper surfaces and side surfaces of the first and second floating gate electrodes. A second gate insulating film is formed on a surface of the semiconductor substrate located between the first and second floating gate electrodes. A control gate electrode is formed on surfaces of the interlayer insulating film and the second gate insulating film. Impurity is introduced into the semiconductor substrate using an end of the first floating gate electrode as a mask to form a first impurity region of a second conductivity type having a region overlapping with the one end of the first floating gate electrode. Impurity is introduced into the semiconductor substrate using an end of the second floating gate electrode as a mask to form a second impurity region of the second conductivity type having a region overlapping with the one end of the second floating gate electrode.

Thereby, the manufacturing process can be simplified as compared with the case where the first and second impurity regions are formed independently.

The foregoing and other objects, features, aspect and advantages of the present invention will become more apparent from the following detailed description of the present invention when taken in conjunction with the accompanying drawings.

DESCRIPTION OF THE PREFERRED EMBODIMENTS

Figure 1:
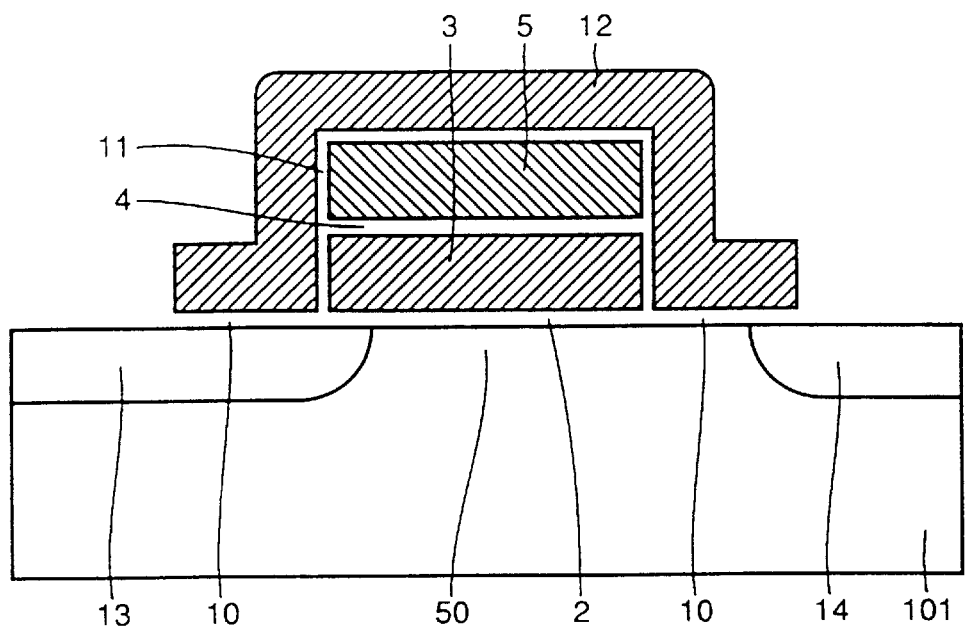
FIG. 1 is a cross section of a flash memory of a first embodiment of the invention.

Embodiments of the invention will be described below with reference to the drawings. In a first embodiment, as shown in FIG. 1, a first impurity diffusion layer 13 and a second impurity diffusion layer 14 are formed on a main surface of a semiconductor substrate 101 and are spaced by a predetermined distance to define a channel region 50 therebetween. A first floating gate electrode 3 having an end overlapping with first impurity diffusion layer 13 is formed on channel region 50 with a first gate insulating film 2 therebetween. A control gate electrode 5 is formed on first floating gate electrode 3 with a first interlayer insulating film 4 therebetween. A second interlayer insulating film 11 is formed on upper and side surfaces of control gate electrode 5 and side surfaces of first floating gate electrode 3.

A second gate insulating film 10 continuous to first gate insulating film 2 is formed on the main surface of semiconductor substrate 101. Surfaces of second interlayer insulating film 11 and second gate insulating film 10 are covered with a second floating gate electrode 12. An end of second floating gate electrode 12 near second impurity region 14 overlaps with second impurity diffusion layer 14. Owing to provision of second floating gate electrode as described above, the first embodiment can independently effect writing, erasing and reading on first floating gate electrode 3 and second floating gate electrode 12 with one control gate electrode 5. Thereby, a memory capacitance can be doubled while maintaining a memory size similar to that in the prior art. Consequently, the degree of integration can be substantially improved.

Figure 2:
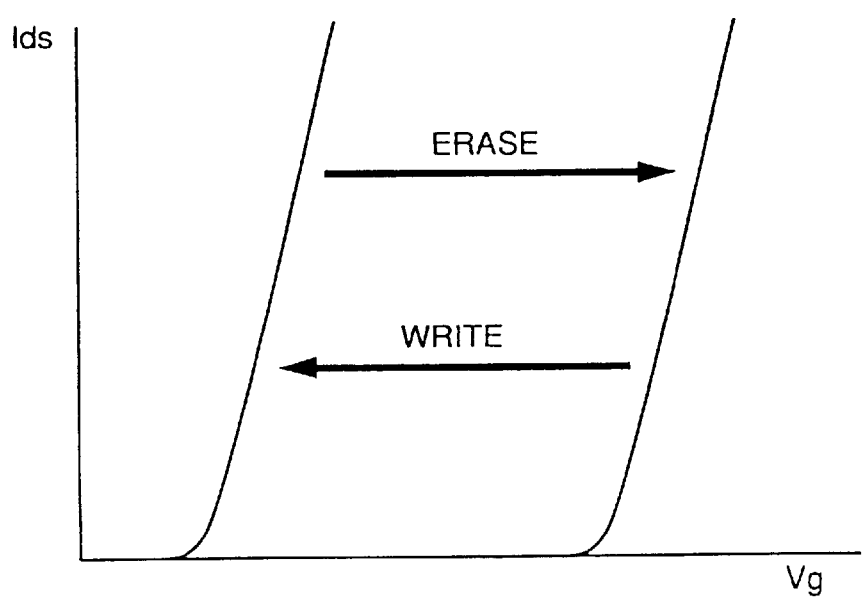
FIG. 2 shows a concept of variation of characteristics of a memory transistor caused by writing/erasing of the flash memory of the first embodiment of the invention.

Referring to FIGS. 2 to 6, operation of the flash memory of the first embodiment will be described below. In the present invention, the written/erased states are opposite to those of the conventional flash memory already described as the prior art. More specifically, as shown in FIG. 2, the erased state is attained when electrons are held in the floating gate electrode and the threshold voltage of the memory transistor viewed from the control gate electrode is high. The written state is attained when electrons are removed from the floating gate electrode and the threshold voltage of the memory transistor is low.

Figure 3:
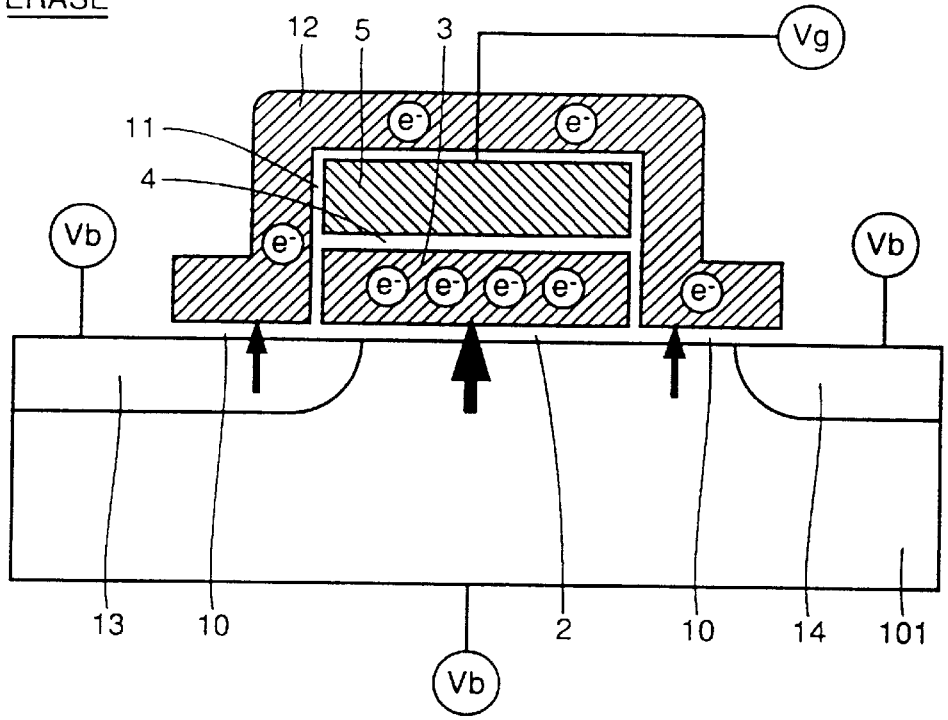
FIG. 3 shows a concept of erasing of the flash memory of the first embodiment shown in FIG. 1.

Referring first to FIG. 3, the erasing will be described below. For erasing, a voltage Vg of about 10V is applied, for example, to control gate electrode 5, and a voltage Vb of about −10V is applied to the semiconductor substrate 101 or a well (not shown) formed at the memory transistor. The first and second impurity regions 13 and 14 are supplied with the same voltage Vb as semiconductor substrate 101 or set to the grounded or open state.

In the above state, first floating gate electrode 3 has a potential which substantially depends on a capacitance coupling of a capacitance between the control gate electrode and first floating gate electrode and a capacitance between the first floating gate electrode and semiconductor substrate, and on a quantity of electrons in the first floating gate electrode. A high electric field across the first floating gate electrode and semiconductor substrate acts to inject electrons into first floating gate electrode 3.

Likewise, second floating gate electrode 12 has a potential which substantially depends on a capacitance coupling of a capacitance between the control gate electrode and second floating gate electrode and a capacitance between the second floating gate electrode and semiconductor substrate, and on a quantity of electrons in the second floating gate electrode. A high electric field across the second floating gate electrode and semiconductor substrate acts to inject electrons into second floating gate electrode 12.

Figure 4:
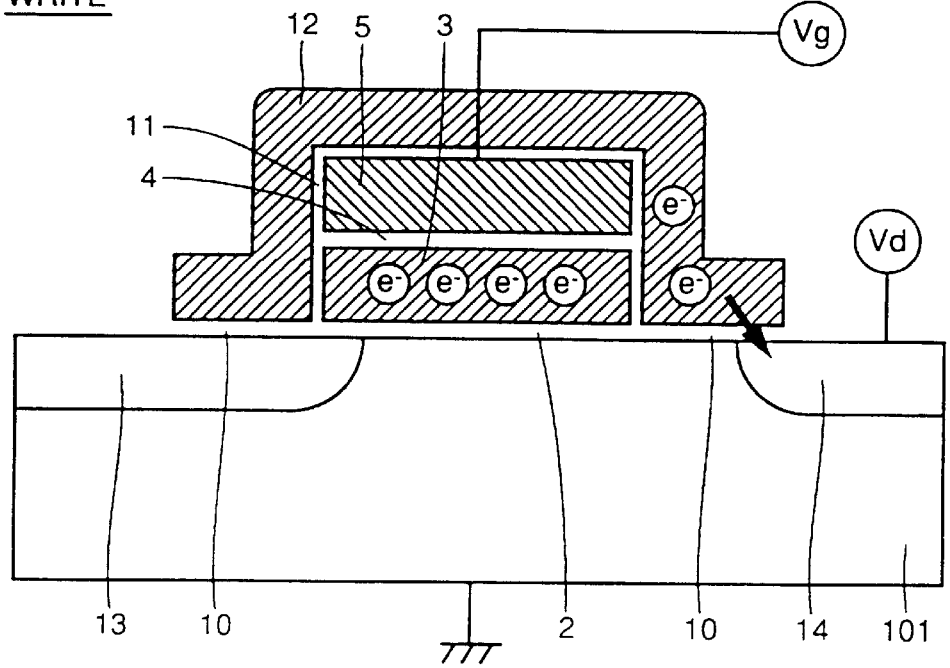
FIG. 4 shows a concept of writing of the flash memory of the first embodiment shown in FIG. 1.

Referring to FIG. 4, writing will now be described below. For writing information into second floating gate electrode 12, i.e., for removing electrons from second floating gate electrode 12, a negative potential of about −10V is applied, for example, to control gate electrode 5, and voltage Vd from about 5V to about 10V is applied to second impurity diffusion layer 14. Semiconductor substrate 101 is grounded, and first impurity diffusion layer 13 is set to the open state.

In the above state, second floating gate electrode has a potential which substantially depends on a capacitance coupling of a capacitance between the control gate electrode and second floating gate electrode and a capacitance between the second floating gate electrode and second impurity diffusion layer, and on a quantity of electrons in the second floating gate electrode. A high electric field across the second floating gate electrode and second impurity diffusion layer acts to remove electrons in second floating gate electrode 12 toward second impurity diffusion layer 14. In this writing, the capacitance between the second floating gate electrode and second impurity diffusion layer is smaller than a capacitance between the second floating gate electrode and semiconductor substrate, and this difference is larger than that during the erasing. Therefore, the potential difference applied for writing information into the memory transistor can be smaller than that required for the erasing.

The writing can be effected on first floating gate electrode 3 by applying similar voltages to control gate electrode 5 and first impurity diffusion layer 13.

Based on the principle of writing/erasing, writing can be performed a bit at a time, and erasing can be performed a control gate at a time. Thereby, the writing/erasing block sizes can be set based on these units, i.e., bit and control gate.

Figure 5:
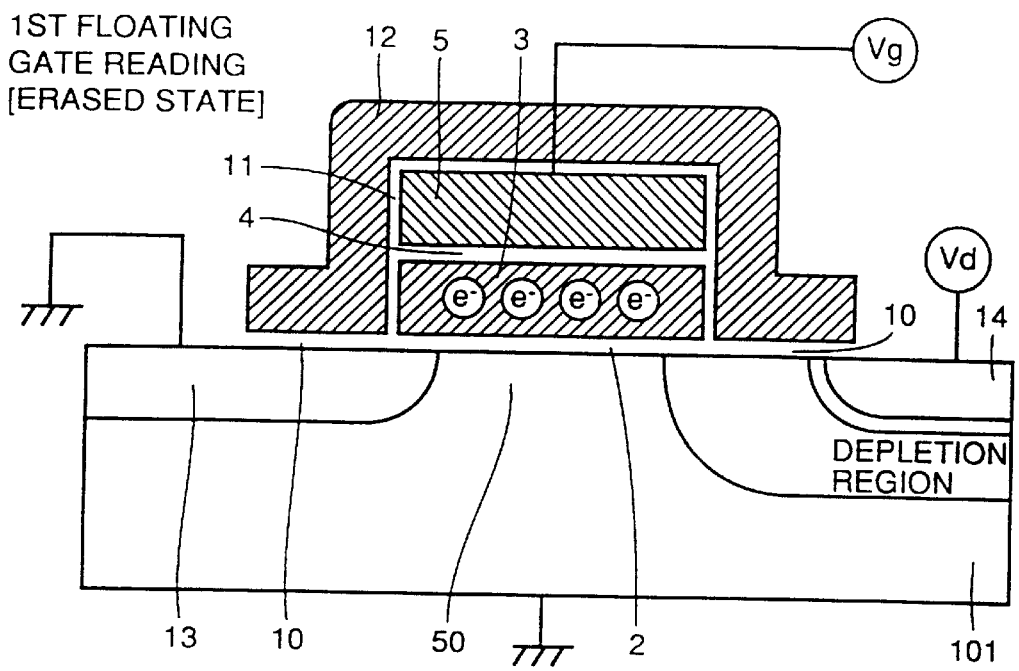
FIG. 5 shows a concept of reading of the flash memory in an erased state shown in FIG. 1.
Figure 6:
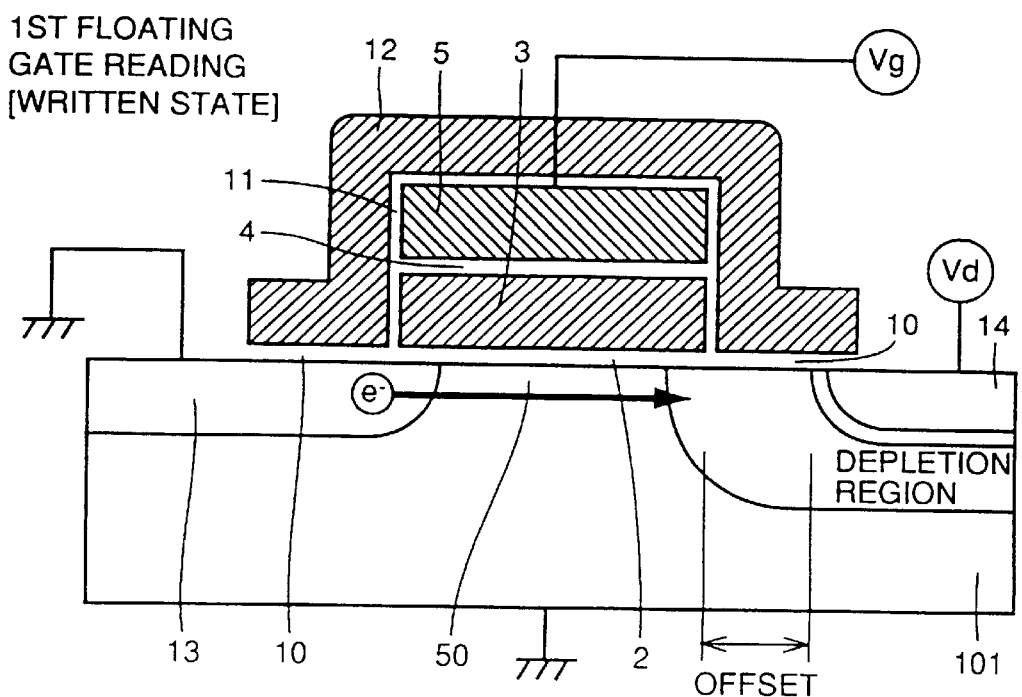
FIG. 6 shows a concept of reading of the flash memory in written state shown in FIG. 1.
Figure 7:
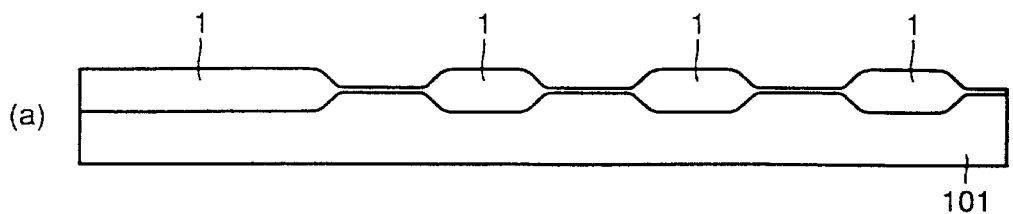
FIGS. 7 to 13 are cross sections taken along line perpendicular to the section of the flash memory of the first embodiment shown in FIG. 1 and showing 1st to 7th steps in a manufacturing process, respectively.
Figure 8:
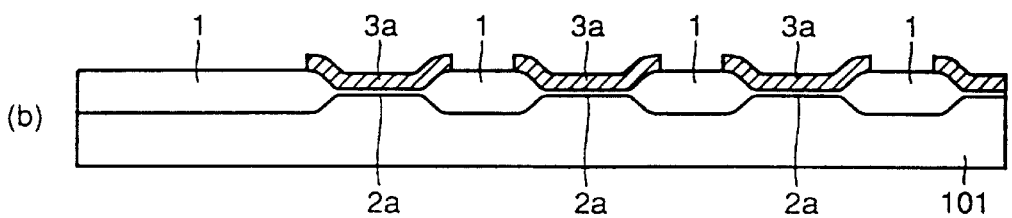
Figure 9:
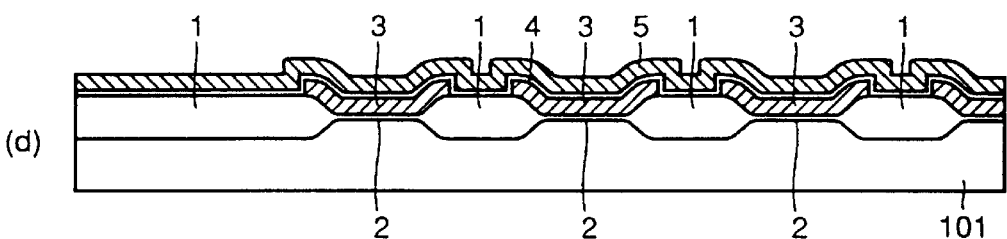
Figure 10:
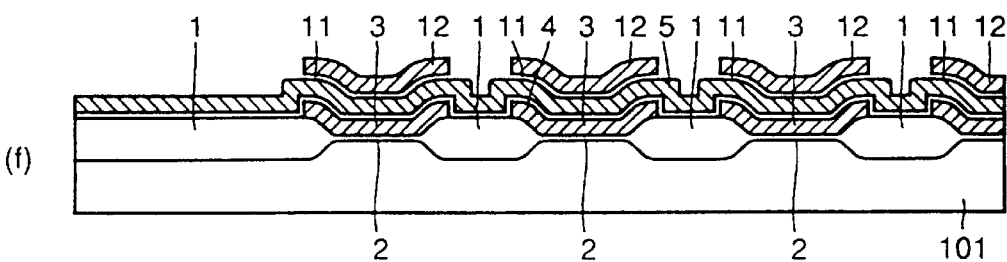
Figure 11:
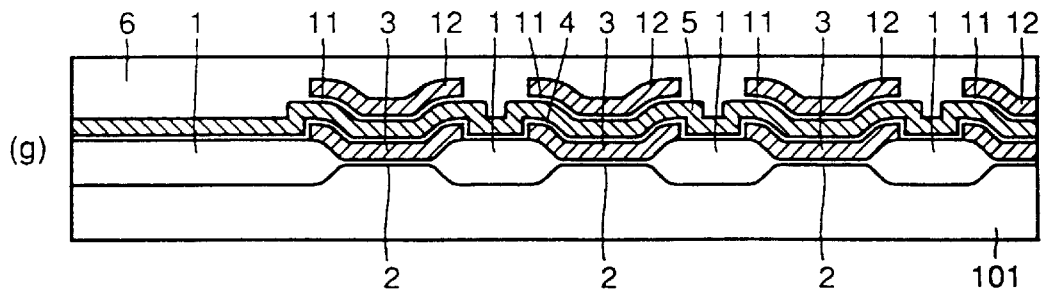
Figure 12:
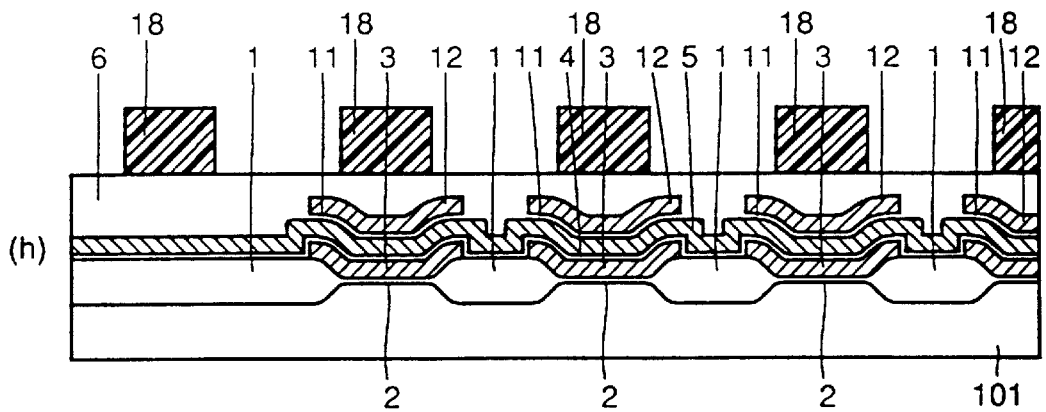
Figure 13:
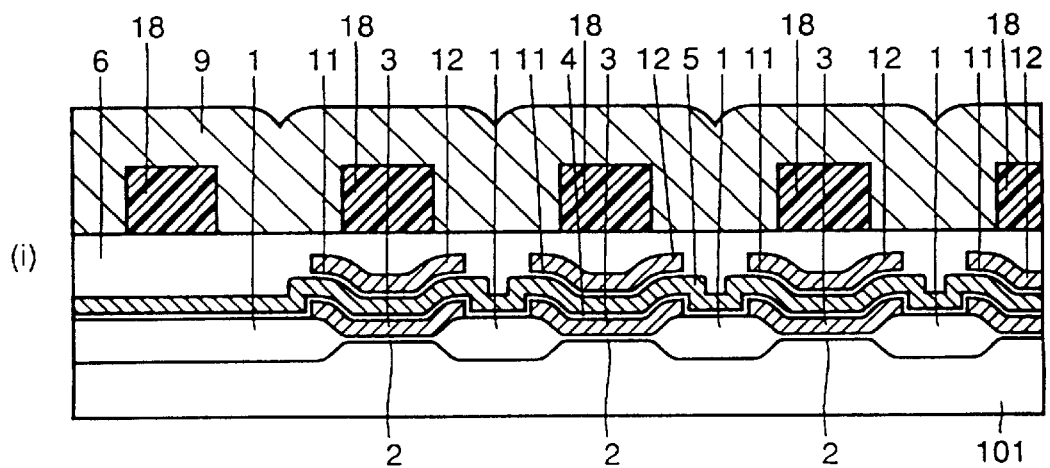
Figure 14:
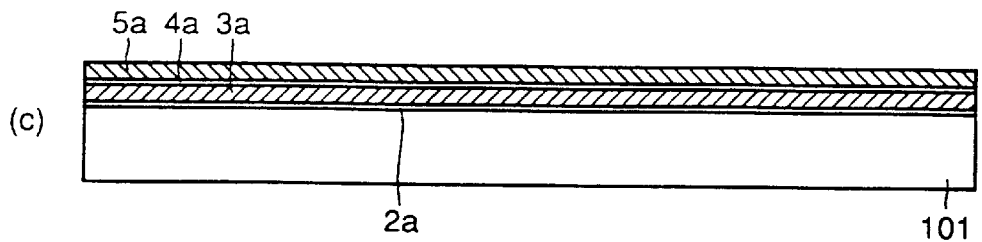
FIGS. 14 to 20 are cross sections taken along line parallel to the section of the flash memory of the first embodiment shown in FIG. 1 and showing 1st to 7th steps in a manufacturing process, respectively.
Figure 15:
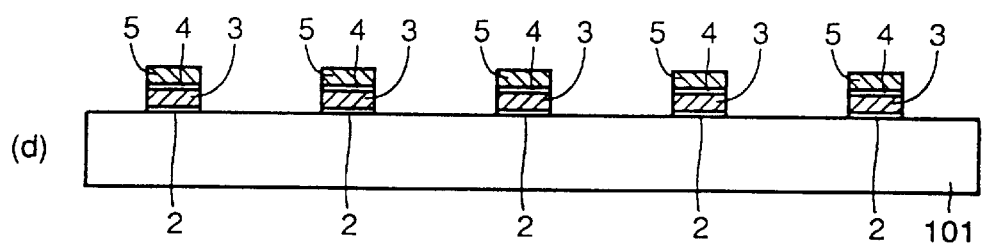

Referring to FIGS. 5 and 6, reading will be described below. When it is to be read, for example, whether first floating gate electrode 3 is in the erased state shown in FIG. 5 or the written state shown in FIG. 6, voltage Vd of from about 1 to about 5V is applied, e.g., to second impurity diffusion layer 14, and voltage Vg of about 5V is applied to control gate electrode 5. When first floating gate electrode 3 has accumulated electrons as shown in FIG. 5, i.e., is in the erased state, channel region 50 under first floating gate electrode 3 is not inverted by the potential of electrons accumulated in first floating gate electrode 3, so that a current does not flow through the memory transistor.

Meanwhile, when first floating gate electrode 3 has not accumulated electrons as shown in FIG. 6, i.e., is in the written state, the voltage applied to control gate electrode 5 raises the potential of first floating gate electrode 3, so that channel region 50 under first floating gate electrode 3 is inverted. Second impurity diffusion layer 14 and channel region 50 under first floating gate electrode 3 are offset from each other. In this case, whether a current flows or not depends on presence and absence of electrons in second floating gate electrode 12. The condition for voltage application and the quantity of offset may be determined to deplete a region under second floating gate electrode 12 by voltage Vd applied to second impurity diffusion layer 14, whereby the current surely flows when electrons are not accumulated in first floating gate electrode 3, regardless of presence and absence of electrons in second floating gate electrode 12.

When information is to be read from second floating gate electrode 12, this can be done in the same manner as the operation of reading information from first floating gate electrode 3 described above. In this case, voltage Vd is applied to first impurity diffusion layer 13, and voltage Vg is applied to control gate electrode 5.

As described above, the flash memory of the first embodiment can independently effect writing, erasing and reading on the two, i.e., first and second floating gate electrodes 3 and 13 with one control gate electrode 5. Therefore, the degree of integration can be substantially doubled as compared with the prior art.

Referring to FIGS. 7 to 20, a process of manufacturing the flash memory of the first embodiment will be described below. The process steps shown in FIGS. 7 to 9 and FIGS. 14 and 15 are the same as those in the conventional process. Thus, the steps from the start to formation of control electrodes 5 are the same as those in the prior art.

Figure 16:
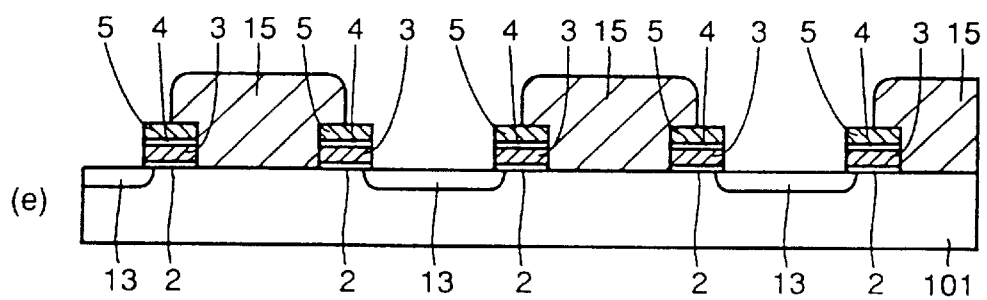
Figure 17:
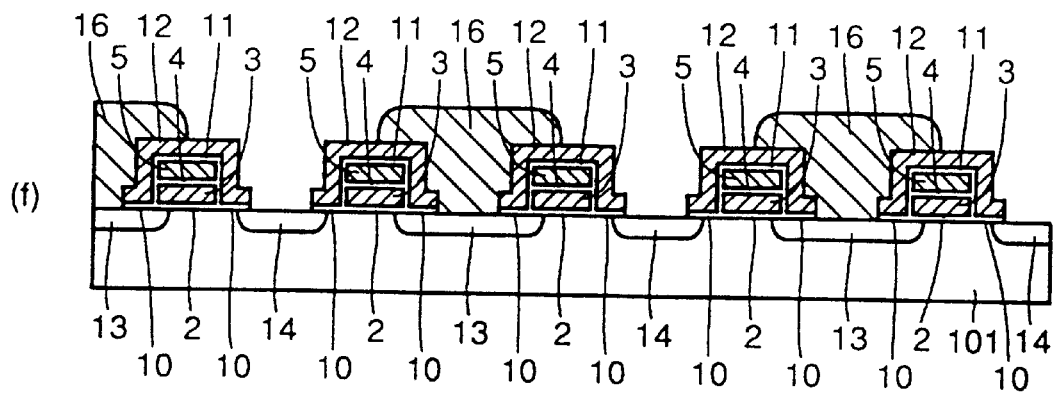
Figure 18:
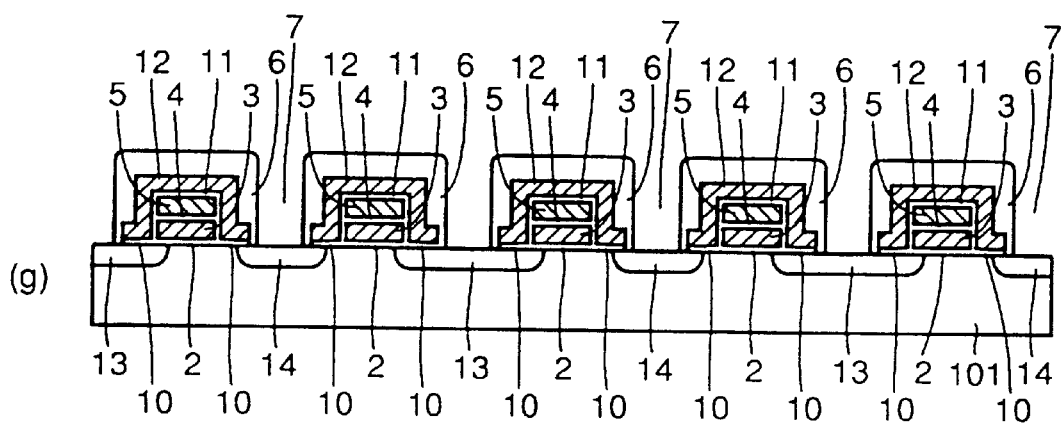
Figure 19:
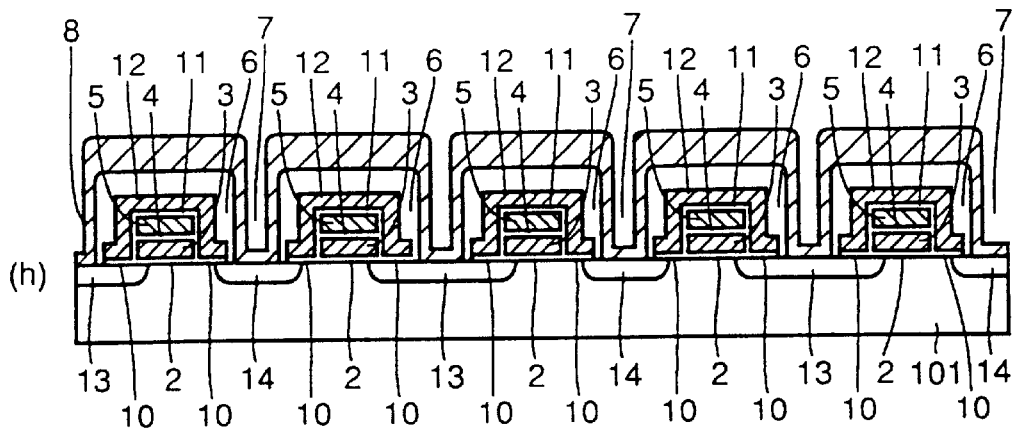
Figure 20:
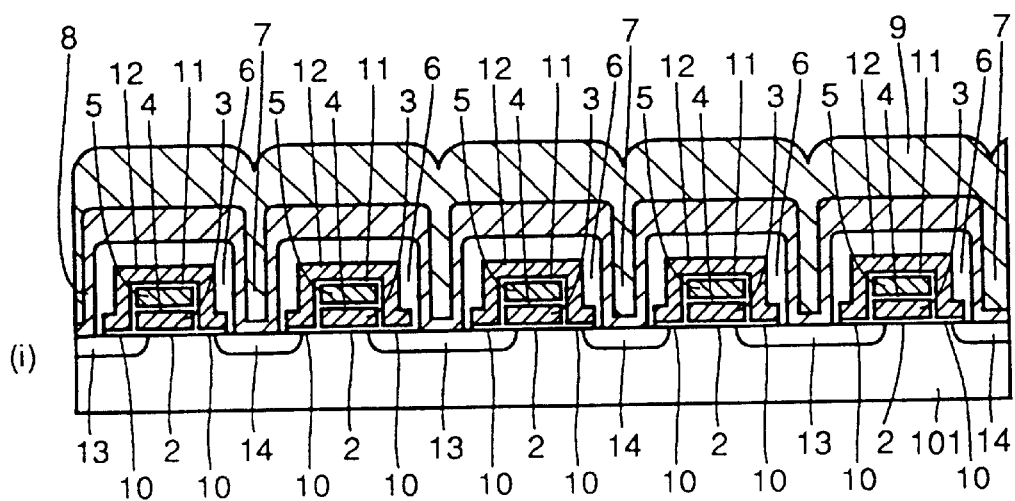

Then, as shown in FIG. 16, photolithography is used to form a resist pattern 15 exposing only one side of each first floating gate electrode 3. Using resist pattern 15 and control electrodes 5 as a mask, impurity is ion-implanted into semiconductor substrate 101 to form impurity diffusion layers 13 of a conductivity type opposite to that of semiconductor substrate 101 in a self-aligned manner with respect to first floating gate electrodes 3.

As shown in FIGS. 10 to 17, the thermal oxidation method or CVD method is executed to form second gate insulating films 10 and second interlayer insulating films 11 at the same step. The CVD method is then executed to from a second floating gate layer (not shown) on second gate insulating films 10 and second interlayer insulating films 11, and subsequently, photolithography and dry etching technique are used to pattern the second floating gate electrode layer.

This completes each floating gate electrode 12 which covers first floating gate electrode 3 and control gate electrode 5 and extends up to a position on semiconductor substrate 101.

Thereafter, photolithography is used to from a resist pattern 16 exposing only regions not provided with first impurity diffusion layers 13. Using resist pattern 16 and second floating gate electrodes 12 as a mask, impurity is ion-implanted into semiconductor substrate 101 to form second impurity diffusion layers 14 in a self-aligned manner with respect to second floating gate electrodes 12. Thereafter, resist pattern 16 is removed.

As shown in FIGS. 11 to 18, an interlayer insulating film 6 is formed by the CVD method similarly to the conventional manufacturing process, and subsequently contact holes 7 are formed at interlayer insulating film 6 by the photolithography and dry etching technique.

As shown in FIGS. 12 to 19, a metal interconnection layer (not shown) is formed, e.g., by the sputtering method, and subsequently is patterned by the photolithography and dry etching technique. Thereby, a metal interconnection layer 18 forming the bit lines and source line is completed.

Finally, as shown in FIGS. 13 to 20, a manufacturing process similar to the prior art is executed, and more specifically, a surface protective film 9 is formed to cover portions other than bonding pad connections (not shown) by the CVD method.

As described above, the flash memory of the first embodiment shown in FIG. 1 can be manufactured easily by the manufacturing process similar to the prior art.

Figure 21:
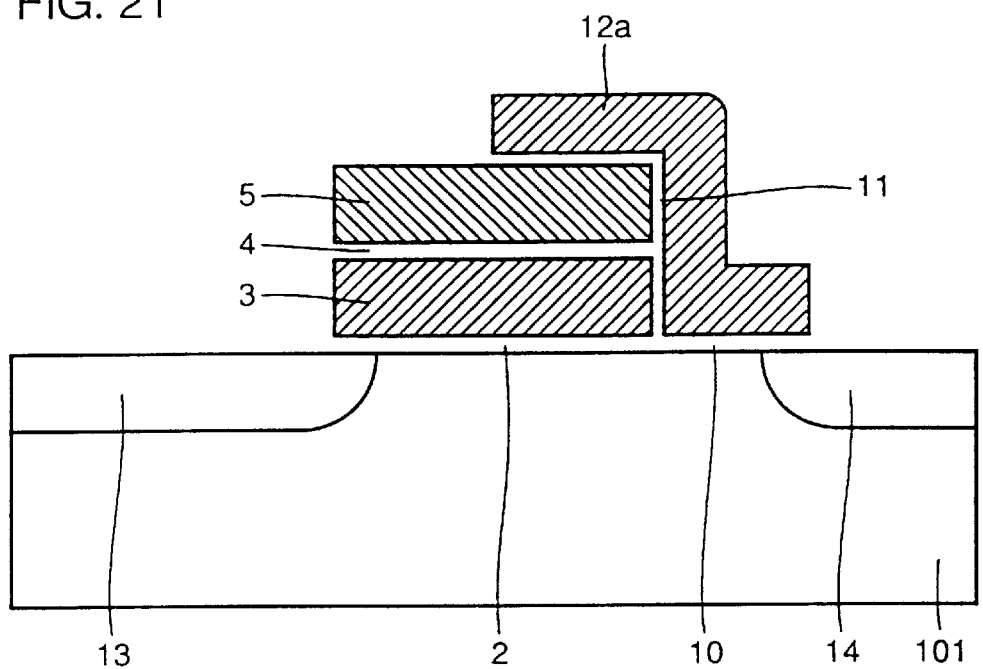
FIG. 21 is a cross section showing a flash memory of a second embodiment of the invention.

Referring to FIG. 21, a flash memory of a second embodiment is different from the first embodiment shown in FIG. 1 in that an end of a second floating gate electrode 12a is not extended above impurity diffusion layer 13 but is located above a region at which control gate electrode 5 is formed. The other end of second floating gate electrode 12a is formed similarly to the first embodiment, and more specifically is located over second impurity diffusion layer 14 with second gate insulating film 10 therebetween.

Similarly to the first embodiment, the structure described above can independently effect writing, erasing and reading on two, i.e., first and second floating gate electrodes 3 and 12a with one control gate electrode 5. As a result, the degree of integration can be substantially doubled as compared with the prior art. This second embodiment makes the manufacturing process somewhat difficult as compared with the first embodiment, because the capacitance between the second floating gate electrode and control gate electrode and the capacitance between the second floating gate electrode and semiconductor substrate vary due to mask misregistration between the control gate electrode and second floating gate electrode.

In this second embodiment, however, impurity is implanted into semiconductor substrate 101 with a mask formed of second floating gate electrode 12a, control gate electrode 5 and floating gate electrode 3 after formation of second floating gate electrode 12a, so that first impurity diffusion layer 13 and second impurity diffusion layer 14 can be formed at the same step. Therefore, the manufacturing process can be further simplified as compared with the first embodiment.

Figure 22:
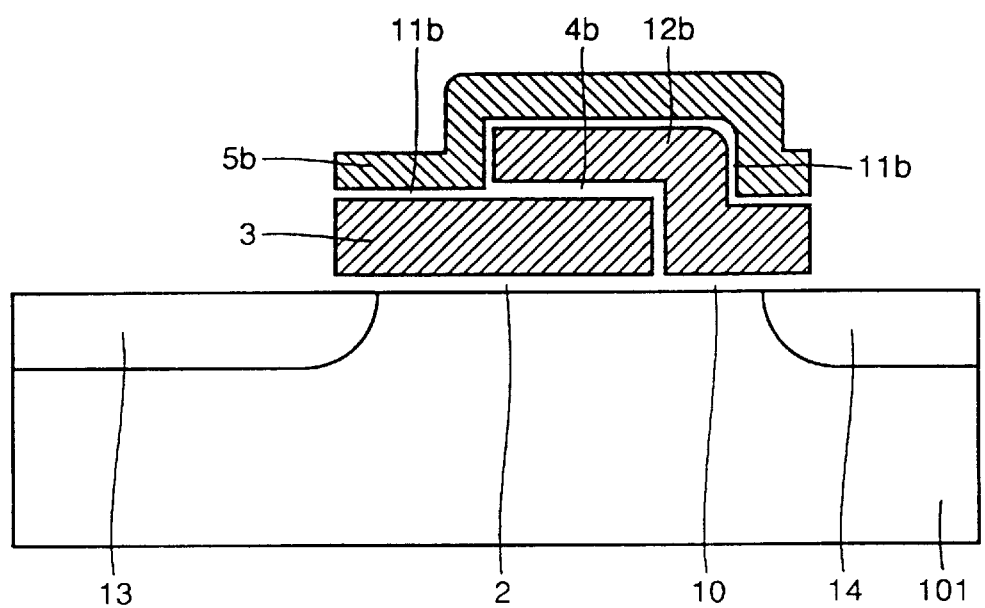
FIG. 22 is a cross section showing a flash memory of a third embodiment of the invention.

Referring to FIG. 22, a third embodiment is different from the first and second embodiments in that a second floating gate electrode 12b is formed under a control gate electrode 5b. More specifically, second floating gate electrode 12b is formed on the upper and side surfaces of first floating gate electrode 3 with a first interlayer insulating film 4b therebetween. An end of second floating gate electrode 12b is formed on a region at which first floating gate electrode 3 is formed, and the other end thereof is extended over semiconductor substrate 101 to overlap with second impurity diffusion layer 14 with second gate insulating film 10 therebetween.

Control gate 5b is formed on the upper surface of first floating gate electrode 3 with a first interlayer insulating film 4b therebetween, and is formed also on side and upper surfaces of second floating gate electrode 12b with a second interlayer insulating film 11b therebetween. A side surface of control gate electrode 5b and a side surface of first floating gate electrode 3 adjacent thereto are aligned substantially on the same straight line, and the other side surface of control gate electrode 5b and a side surface of second floating gate electrode 10b adjacent thereto are aligned substantially on the same straight line.

The flash memory of the third embodiment described above is manufactured by the following process. The process steps from the start to formation of first floating gate electrode 3 are the same as those in the prior art. Thereafter, a second interlayer insulating layer (not shown) and a second floating gate electrode layer (not shown) on the same are formed and subsequently patterned by the photolithography and dry etching technique to form second interlayer insulating film 4b and second floating gate electrode 12b.

Then, a second interlayer insulating layer (not shown) and a control gate electrode layer (not shown) are formed and subsequently patterned by the photolithography and dry etching technique to form second interlayer insulating film 11b and control gate electrode 5b. Simultaneously with the patterning for forming control gate electrode 5b, the patterning may be effect on the end of first floating gate electrode 3 and the end of second floating gate electrode 12b remote from overlapped portions of first and second floating gate electrodes 3 and 12. Thereby, one side surface of gate electrode 5b and one side surface of first floating gate electrode 3 are formed substantially on the same straight line, and the other side surface of control gate electrode 5b and one side surface of second floating gate electrode 12b are formed substantially on the same straight line. In this case, control gate electrode 5b is formed and subsequently impurity is implanted into semiconductor substrate 101 using control gate electrode 5b as a mask, so that first and second impurity diffusion layers 13 and 14 are formed in a self-aligned manner with respect to control gate electrode 5b (i.e., first and second floating gate electrodes 3 and 5b). Therefore, this embodiment can further simplify the manufacturing process as compared with the first embodiment.

Thereafter, steps similar to those in the prior art are executed to form interlayer insulating film 6, contact holes 7, metal interconnection layer 8 and surface protective film 9. This third embodiment can employ the method similar that of the first embodiment so that writing, erasing and reading can be effected on first and second floating gate electrodes 3 and 5b with one control gate electrode 5b. Thereby, the third embodiment can substantially double the degree of integration similarly to the first and second embodiments.

Figure 23:
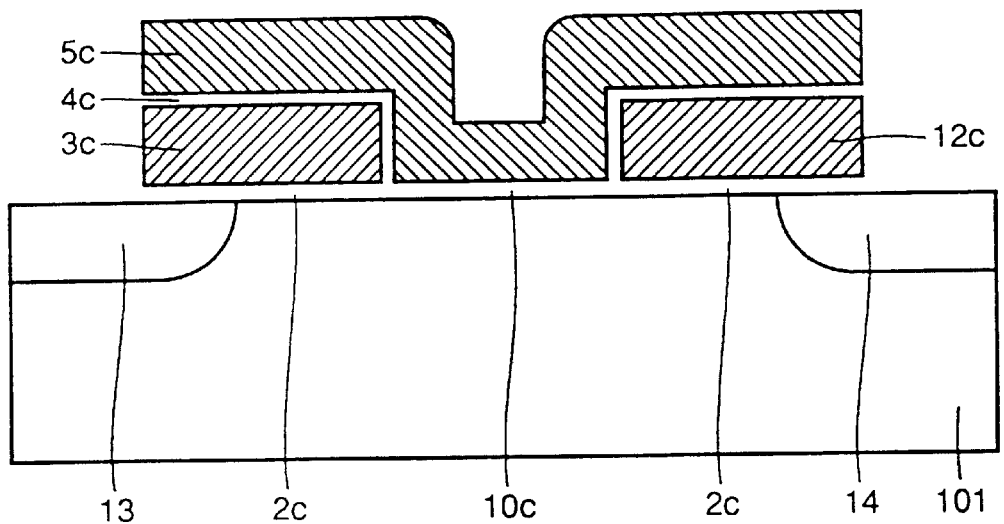
FIG. 23 is a cross section showing a flash memory of a fourth embodiment of the invention.

Referring to FIG. 23, a fourth embodiment is provided with a first floating gate electrode 3c and a second floating gate electrode 12c which are spaced by a predetermined distance and are formed on the main surface of semiconductor substrate 101 with a first gate insulating film 2c therebetween. A control gate electrode 5c is formed on a region of semiconductor substrate 101 between first and second floating gate electrodes 3c and 12c with a second gate insulating film 15c therebetween, and is formed also on upper and side surfaces of first and second floating gate electrodes 3c and 12c with a first interlayer insulating film 4c therebetween. The memory transistor size in the fourth embodiment thus constructed is somewhat larger than that in the first to third embodiments.

In this fourth embodiment, however, first and second floating gate electrodes 3c and 12c can be formed at the same step, so that the manufacturing process can be simpler than those in the first to third embodiments. Also in this fourth embodiment, control gate electrode 5c covers the side surfaces of first and second floating gate electrodes 3c and 12c with first interlayer insulating film 4c therebetween, so that a capacitance between first and second floating gate electrodes 3c and 12c and control gate electrode 5c is larger than those in the first to third embodiments. This increases a capacitance coupling ratio, so that the potential of first floating gate electrode 3c during writing and erasing is larger than those in the first to third embodiments. This advantageously facilitates the writing and erasing.

In the fourth embodiment, first and second floating gate electrodes 3c and 12c must be spaced by a distance larger than the resolution limit in the photolithographic step, resulting in reduction of the degree of integration. However, there is such an advantage over the prior art that memory elements at a high density can be manufactured by the process steps substantially equal in number to those in the prior art.

In this fourth embodiment, a parasitic transistor, in which a gate insulating film is formed of second gate insulating film 10c and a gate electrode is formed of control gate electrode 5c, is formed between first floating gate electrode 3c and second floating gate electrode 12c. However, this parasitic transistor has a threshold voltage lower than that of the memory cell transistor. Therefore, whenever the memory transistor is turned on, the parasitic transistor is turned on, so that no disadvantage is caused. The writing, erasing and reading similar to those in the first to third embodiments can be executed in this fourth embodiment.

In the manufacturing process of the flash memory of the fourth embodiment, a first gate insulating layer (not shown) is formed on the main surface of semiconductor substrate 101, and a floating gate electrode layer (not shown) is formed on the first gate insulating layer. Then, the floating gate electrode layer and first gate insulating layer are patterned by the photolithography and dry etching technique to form first and second floating gate electrodes 3c and 12c on first gate insulating film 2c with a predetermined space between each other. Thereafter, an insulating layer (not shown) is formed on the whole surface and a control gate electrode layer (not shown) is formed on the same. These layers are patterned by the photolithography and dry etching technique to form second gate insulating film 10c, first interlayer insulating film 4c and control gate electrode 5c.

Simultaneously with the patterning of control gate electrode 5c, the patterning may be effected on ends of first and second floating gate electrodes 3c and 12c near first and second impurity diffusion layers 13 and 14. In this case, after patterning control gate electrode 5, impurity is ion-implanted into semiconductor substrate 101 using patterned control gate electrode 5 as a mask. Thereby, first and second impurity diffusion layers 13 and 14 can be formed in a self-aligned manner with respect to first and second floating gate electrodes 3c and 12c, respectively. Thereafter, process steps similar to those in the prior art are executed to form interlayer insulating film 6, contact holes 7, metal interconnection layer 8 and surface protective film 9.

Figure 24:
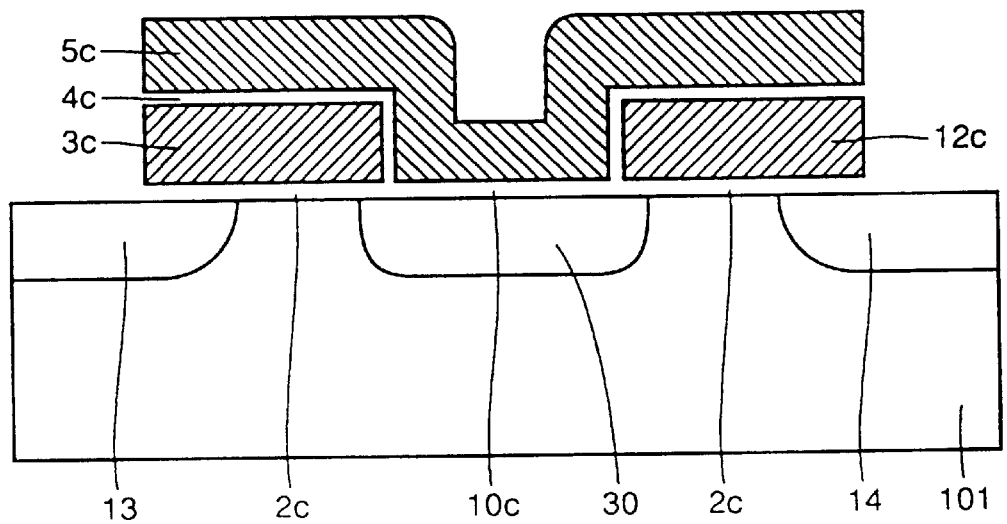
FIG. 24 is a cross section showing a flash memory of a fifth embodiment of the invention.
Figure 25:
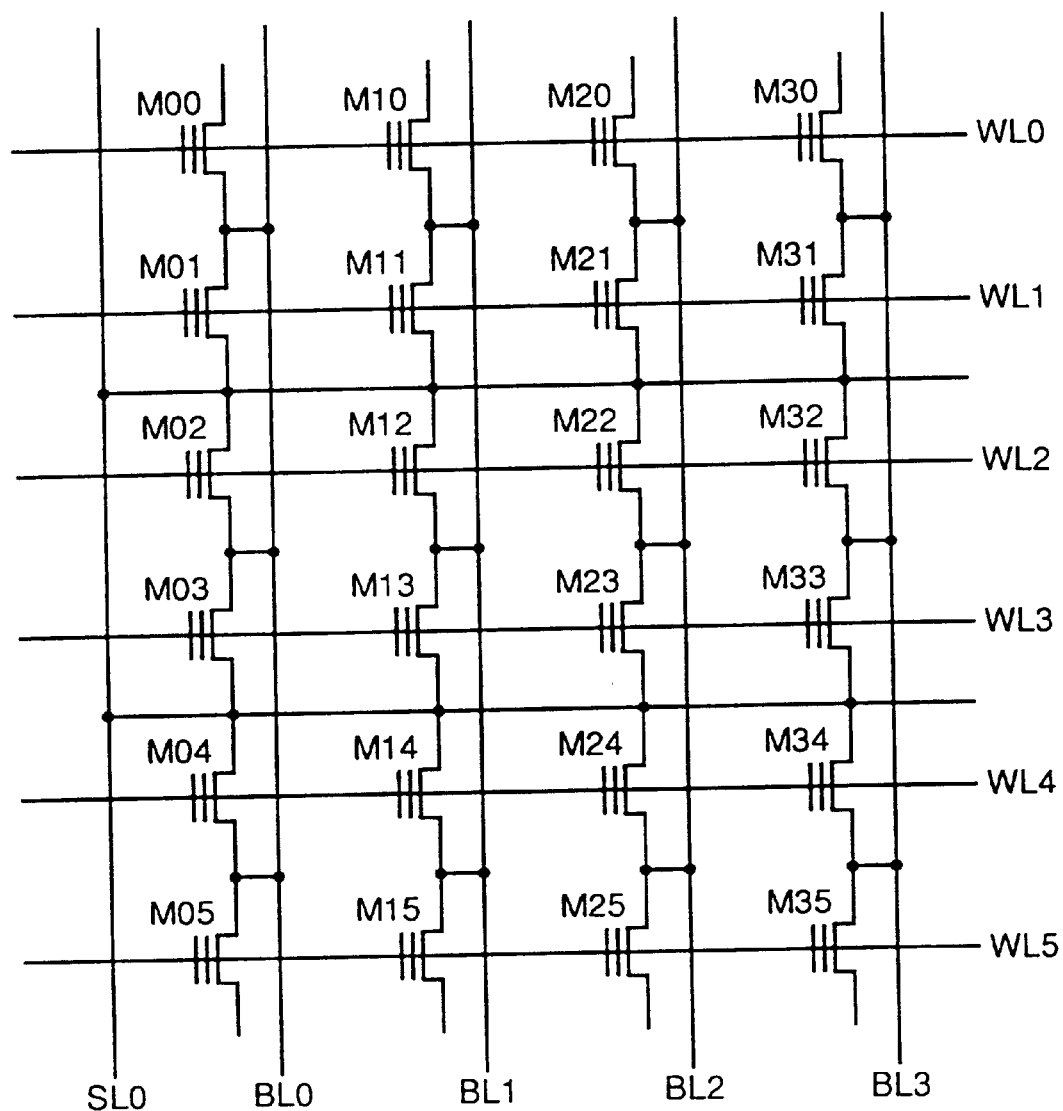
FIG. 25 is an equivalent circuit diagram showing a memory cell array structure of a conventional flash memory.
Figure 26:
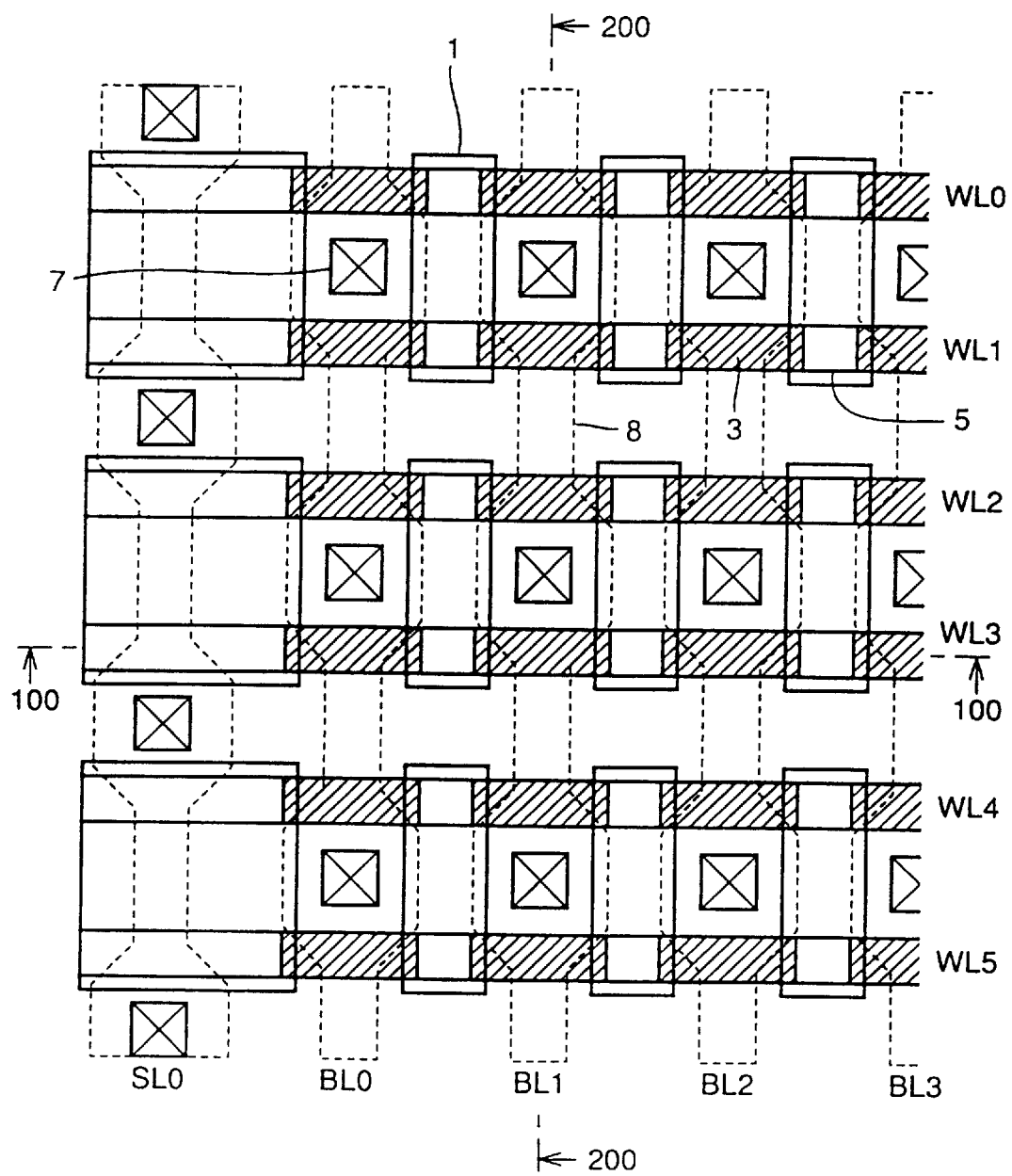
FIG. 26 is a plan showing the memory cell array structure of the conventional flash memory.
Figure 27:
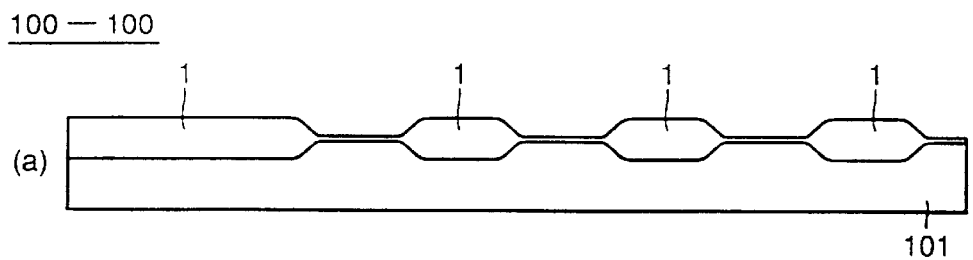
FIGS. 27 to 32 are cross sections of a conventional memory cell array structure taken along line 100—100 in FIG. 26 and showing 1st to 6th steps in a manufacturing process, respectively.
Figure 28:
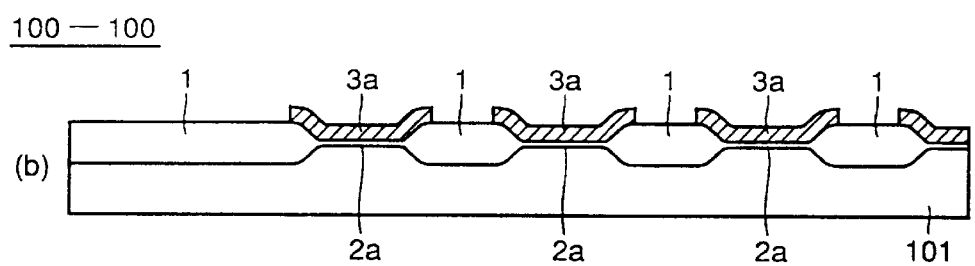
Figure 29:
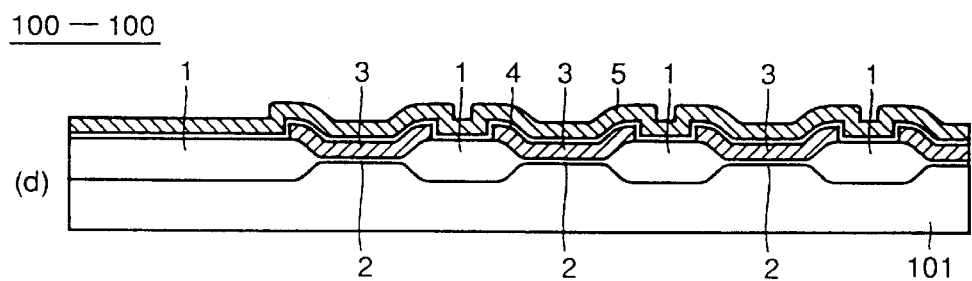
Figure 30:
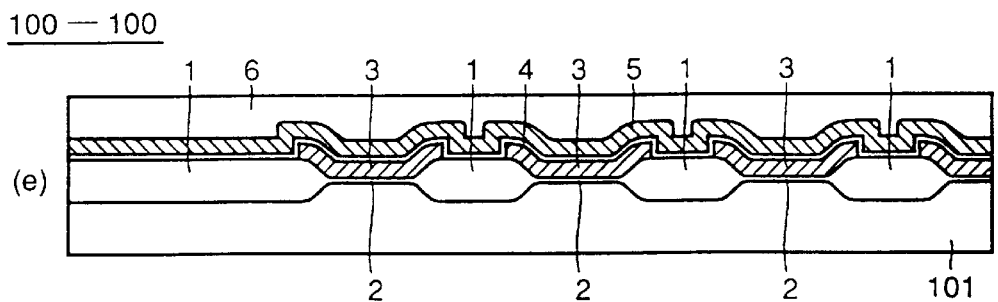
Figure 31:
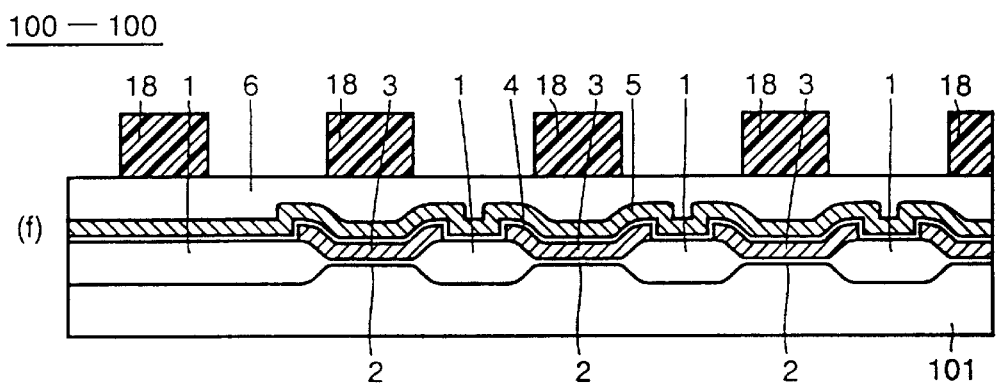
Figure 32:
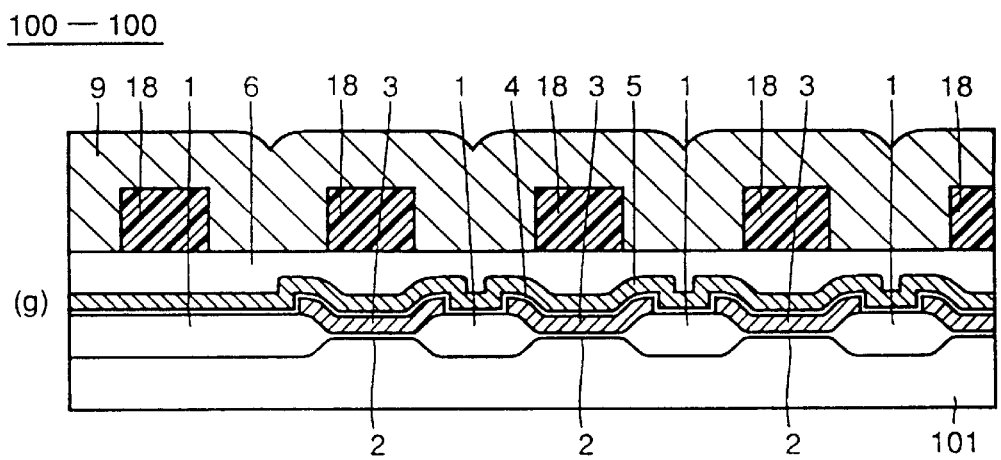
Figure 33:
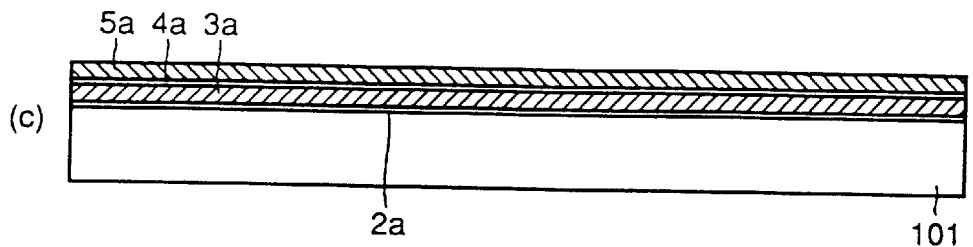
FIGS. 33 to 37 are cross sections of the conventional memory cell array structure taken along line 200-200 in FIG. 26 and showing 1st to 5th steps in the manufacturing process, respectively.
Figure 34:
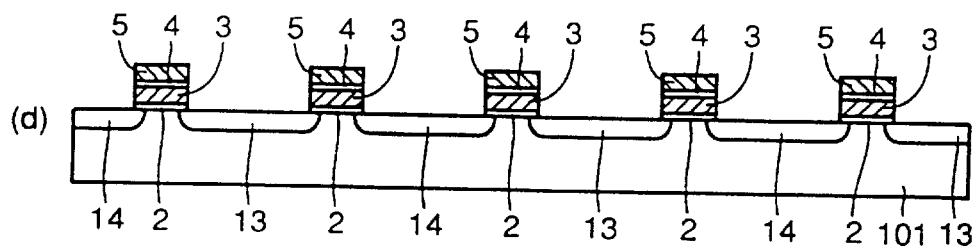
Figure 35:
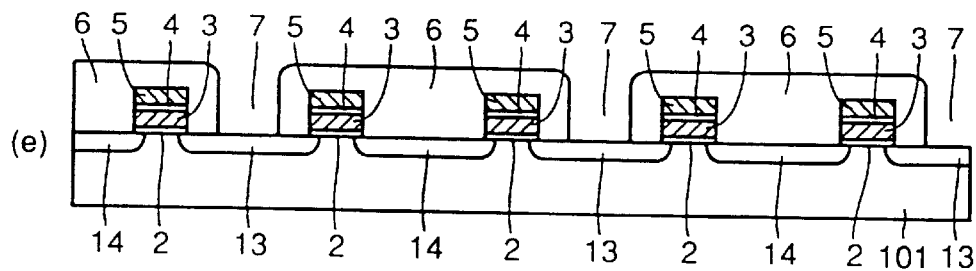
Figure 36:
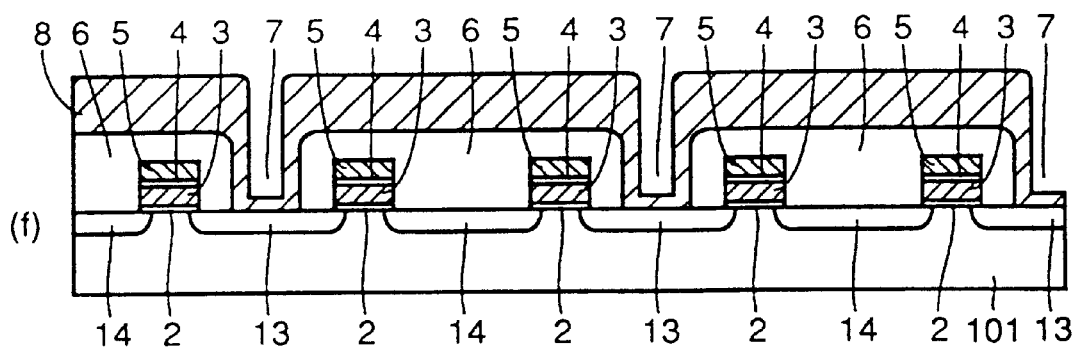
Figure 37:
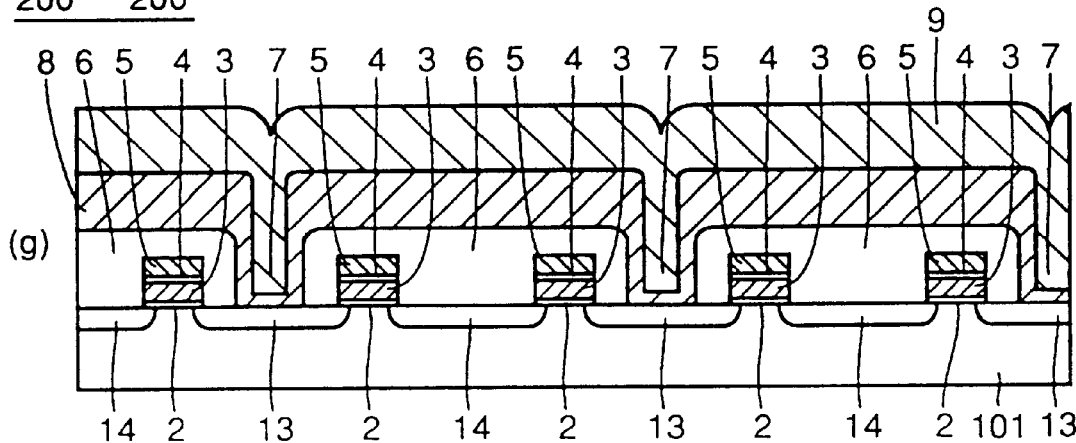
Figure 38:
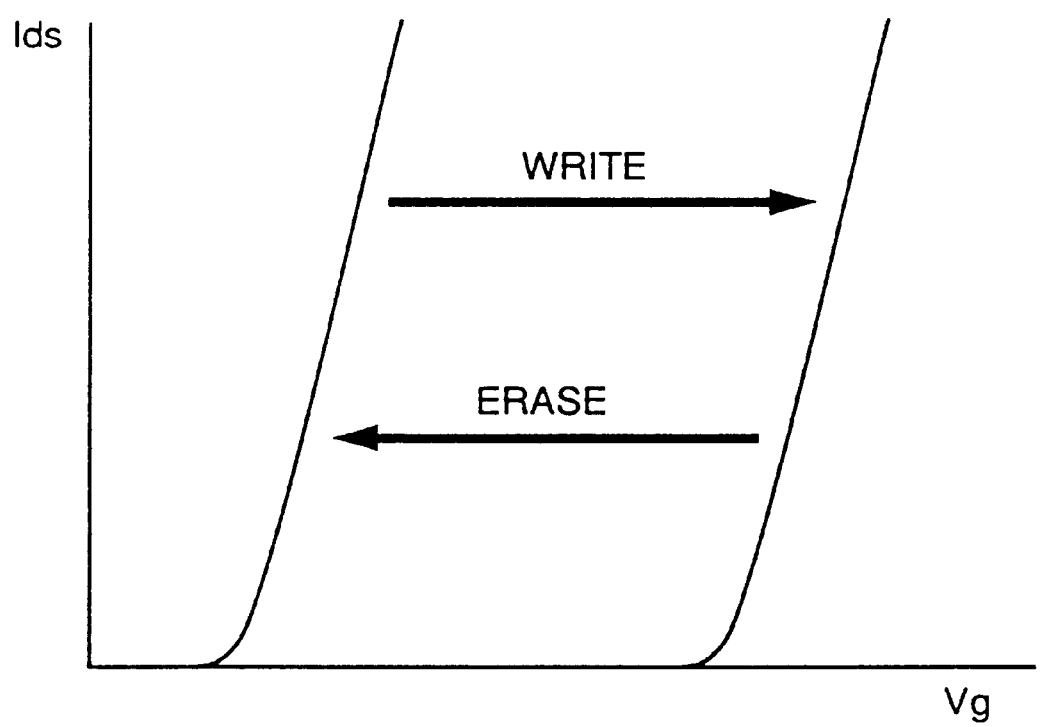
FIG. 38 shows a concept of variation of characteristics of a memory transistor caused by writing/erasing of the conventional flash memory.
Figure 39:
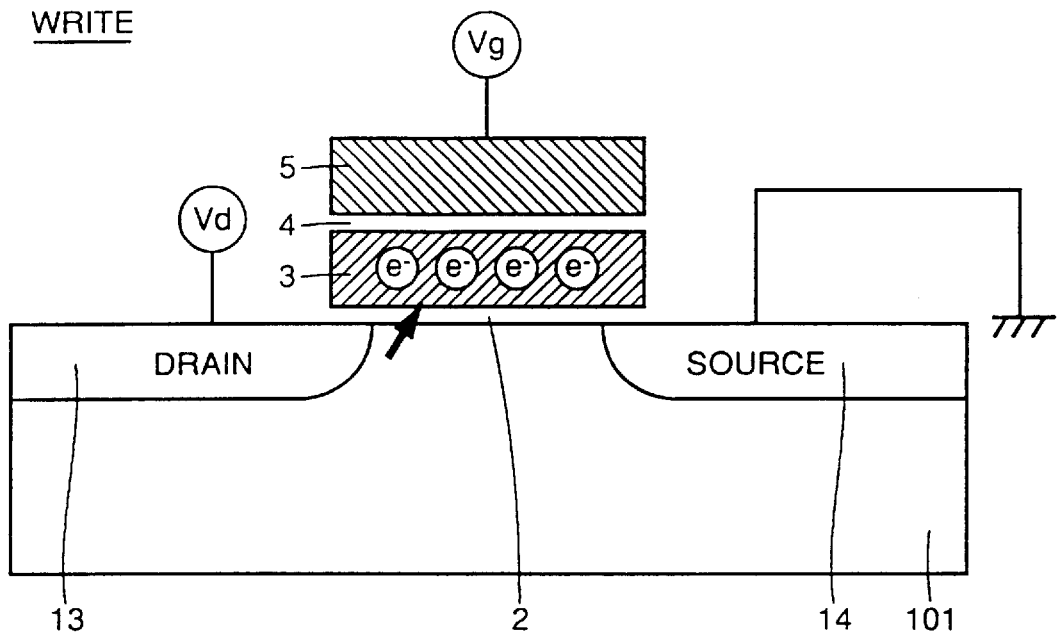
FIG. 39 shows a concept of writing of the conventional flash memory.
Figure 40:
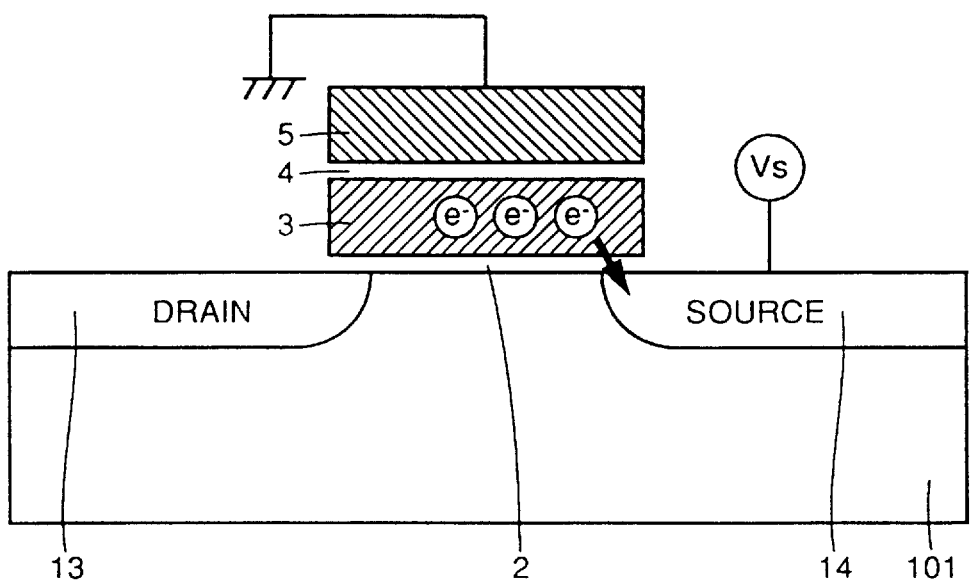
FIG. 40 shows a concept of erasing of the conventional flash memory.
Figure 41:
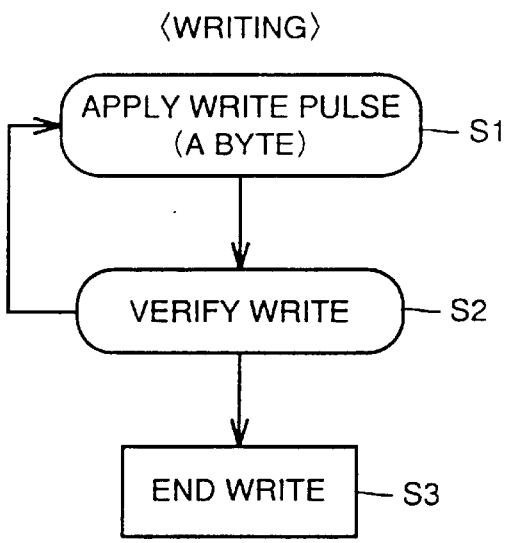
FIG. 41 is a flow chart showing writing of the conventional flash memory.
Figure 42:
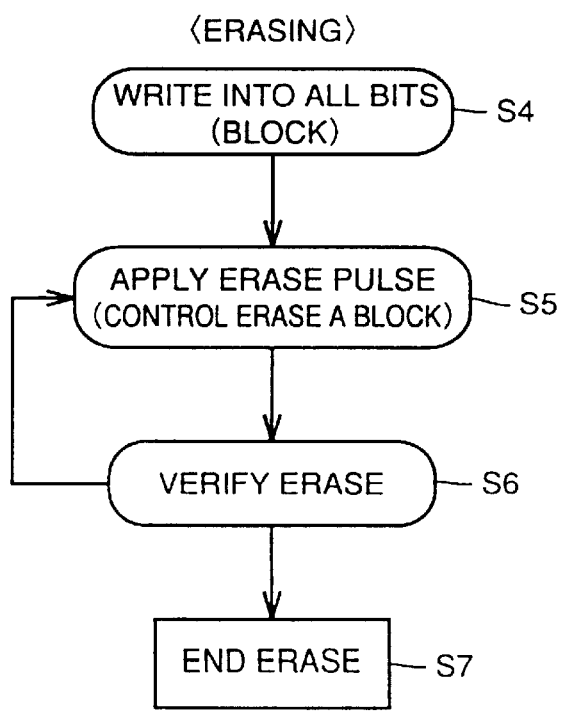
FIG. 42 is a flow chart showing erasing of the conventional flash memory.

Referring to FIG. 24, a fifth embodiment includes a third impurity diffusion layer 30 formed on a surface of a region of semiconductor substrate 101 at which a parasitic transistor is formed in the structure of fourth embodiment. Provision of third impurity diffusion layer described above can advantageously prevent formation of a parasitic transistor. For forming the structure including third impurity diffusion layer 30, first and second floating gate electrodes 3c and 12c are patterned, and subsequently implanted into semiconductor substrate 101 using first and second floating gate electrodes 3c and 12c as a mask. Thereby, first, second and third impurity diffusion layers 13, 14 and 30 are formed.

As described above, the semiconductor device of an aspect of the invention can independently effect writing, erasing and reading on the two, i.e., first and second floating gate electrodes with one control gate electrode. Therefore, the degree of integration can be improved remarkably as compared with the prior art.

According to the method of manufacturing the semiconductor device of another aspect of the invention, the first impurity region having a region overlapping with an end of the first floating gate electrode is formed using the first floating gate electrode as a mask, and the second impurity region having a region overlapping with an end of the second floating gate electrode is formed using the second floating gate electrode as a mask, whereby it is possible to manufacture easily the semiconductor device which can independently effect writing, erasing and reading on the two, i.e., first and second floating gate electrodes with one control gate electrode.

According to the method of manufacturing the semiconductor device of still another aspect of the invention, impurity is introduced into the semiconductor substrate using the control gate electrode as a mask, so that the first impurity region having a region overlapping with the other end of the first floating gate electrode and the second impurity region having a region overlapping with an end of the second floating gate electrode are formed, whereby it is possible to simplify the process of manufacturing the semiconductor device, which can independently effect writing, erasing and reading on the two, i.e., first and second floating gate electrodes with one control gate electrode.

According to the method of manufacturing the semiconductor device of yet another aspect of the invention, the floating gate electrode layer is formed on the first gate insulating film, and then is patterned to form the first and second floating gate electrodes on the first gate insulating film with a predetermined space between each other, so that the manufacturing process can be simpler than that in the case where the first and second floating gate electrodes are independently formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a first gate insulating film on a main surface of a semiconductor substrate of a first conductivity type;

forming a first floating gate electrode on said first gate insulating film;

forming a control gate electrode on said first floating gate electrode with a first interlayer insulating film therebetween;

introducing impurity into said semiconductor substrate using said first floating gate electrode as a mask to form a first impurity region of a second conductivity type having a region overlapping with an end of said first floating gate electrode;

forming a second interlayer insulating film on an upper surface and a side surface of said control gate electrode and a side surface of said first floating gate electrode;

forming a second gate insulating film on the main surface of said semiconductor substrate;

forming a second floating gate electrode on said second interlayer insulating film and said second gate insulating film to have a portion located on said control gate electrode and at least an end extended to a position on said semiconductor substrate near the other end of said first floating gate electrode; and introducing impurity into said semiconductor substrate using said second floating gate electrode as a mask to form a second impurity region of the second conductivity type having a region overlapping with an end of said second floating gate electrode.

2. The method of manufacturing the semiconductor device according to claim 1, wherein said first and second impurity regions are formed at the same step after formation of said second floating gate electrode.

3. The method of manufacturing the semiconductor device according to claim 1, wherein said second interlayer insulating film and said second gate insulating film are formed at the same step.

* * * * *

UNITED STATES PATENT AND TRADEMARK OFFICE
CERTIFICATE OF CORRECTION

PATENT NO.    : 6,362,046 B1
DATED         : March 26, 2002
INVENTOR(S)   : Hajime Arai It is certified that error appears in the above-identified patent and that said Letters Patent is hereby corrected as shown below:

<u>Column 14,</u>
Line 9, after "subsequently". insert -- ions are --

Signed and Sealed this

Fourth Day of February, 2003

JAMES E. ROGAN
*Director of the United States Patent and Trademark Office*